US008624104B2

(12) United States Patent
Bedell et al.

(10) Patent No.: US 8,624,104 B2
(45) Date of Patent: Jan. 7, 2014

(54) HETEROJUNCTION III-V SOLAR CELL PERFORMANCE

(75) Inventors: Stephen W. Bedell, Wappingers Falls, NY (US); Bahman Hekmatshoartabari, Mount Kisco, NY (US); Devendra K. Sadana, Pleasantville, NY (US); Ghavam G. Shahidi, Pound Ridge, NY (US); Davood Shahrjerdi, Ossining, NY (US)

(73) Assignee: International Business Machines Corporation, Armonk, NY (US)

(*) Notice: Subject to any disclaimer, the term of this patent is extended or adjusted under 35 U.S.C. 154(b) by 10 days.

(21) Appl. No.: 13/179,731

(22) Filed: Jul. 11, 2011

(65) Prior Publication Data

US 2013/0014811 A1  Jan. 17, 2013

(51) Int. Cl.
*H01L 31/00* (2006.01)
*H01L 21/00* (2006.01)

(52) U.S. Cl.
USPC .................. 136/255; 438/87; 257/E31.021

(58) Field of Classification Search
USPC .................. 136/255; 257/E31.021; 438/87
See application file for complete search history.

(56) References Cited

U.S. PATENT DOCUMENTS

| 5,290,367 | A  | * | 3/1994 | Hayashi et al. ............... 136/255 |
| 2010/0307572 | A1 |  | 12/2010 | Bedell |
| 2011/0048516 | A1 |  | 3/2011 | Bedell |

OTHER PUBLICATIONS

Yamaguchi, M. et al., "Novel materials for high-efficiency III-V multijunction solar cells", Jul. 30, 2007, Solar Energy 82, pp. 173-180.*
Bullough, T.J. et al., "Effect of increased nitrogen incorporation on the growth of GaInNAs/GaAs", 2003, Solid State Electronics 47, pp. 407-412.*
Barnett, Allen et al., "Milestones Toward 50% Efficient Solar Cell Modules", Sep. 3-7, 2007, $22^{nd}$ European Photovoltaic Solar Energy Conference, pp. 95-100.*
E. Yablonovitch et al, "Nearly ideal InP/In0.53Ga0.47As heterojunction regrowth on chemically prepared In0.53Ga0.47As surfaces." Appl. Phys. Lett., vol. 60, No. 3, Jan. 20, 1992.

* cited by examiner

*Primary Examiner* — Tamir Ayad
(74) *Attorney, Agent, or Firm* — Louis J. Percello; Otterstedt, Ellenbogen & Kammer, LLP

(57) ABSTRACT

An $In_xGa_{1-x}As$ interlayer is provided between a III-V base and an intrinsic amorphous semiconductor layer of a heterojunction III-V solar cell structure. Improved surface passivation and open circuit voltage may be obtained through the incorporation of the interlayer within the structure.

16 Claims, 5 Drawing Sheets

WITHOUT InGaAs INTERLAYER

WITH InGaAs INTERLAYER

COMPARISON OF SRV FOR InGaAs vs GaAs

HETEROJUNCTION III-V SOLAR CELL PERFORMANCE

FIELD OF THE INVENTION

The present invention relates to the physical sciences, and, more particularly, to the field of heterojunction solar cells.

BACKGROUND OF THE INVENTION

Direct gap III-V semiconductor materials have strong absorption properties and have been found to be suitable for high efficiency solar cell applications, particularly portable applications. Small thicknesses of these materials, in the order of a few microns, are sufficient for absorbing a large portion of the solar spectrum. Conventional techniques for making high efficiency III-V solar cells can involve the epitaxial growth of relatively complicated structures using MOCVD (metalorganic chemical vapor deposition) and MBE (molecular beam epitaxy) systems. Despite the high efficiency of epitaxially grown III-V solar cells, the high cost of epitaxy presents challenges to the production of cost-competitive III-V solar cells for terrestrial applications.

GaAs has a relatively wide energy gap (1.4 eV) and in turn offers a high open circuit voltage. Such properties make it suitable for single junction solar cells. GaAs further exhibits high absorption of the solar spectrum that can be converted to a high short circuit current.

SUMMARY OF THE INVENTION

Principles of the invention provide a heterojunction III-V solar cell structure including an interlayer that is effective in reducing the contribution of the surface recombination in the dark current within the structure and improving the open circuit voltage. Techniques for fabricating such a structure are further provided. In accordance with a first aspect, a method is provided that includes obtaining a base layer comprising one of gallium arsenide and $In_yGa_{1-y}As$ where y<x, having a first doping type, forming an epitaxial $In_xGa_{1-x}As$ layer on the base layer where 0.01<x<1 having the first doping type, forming an intrinsic hydrogenated amorphous silicon semiconductor layer on the epitaxial $In_xGa_{1-x}As$ layer, and forming a doped hydrogenated amorphous silicon layer on the intrinsic semiconductor layer. The method may further include forming a transparent conductive layer on the amorphous hydrogenated silicon layer. The intrinsic semiconductor layer can contain germanium and carbon atoms and can be comprised of a plurality of intrinsic semiconductor layers, one or more of which may include germanium and carbon atoms. The doping type of the hydrogenated amorphous silicon layer formed on the intrinsic semiconductor layer may be the opposite type of the base doping type if used to form an emitter and can be the same type as the base if used to form a back surface field (BSF).

In another aspect, an exemplary heterojunction III-V solar cell structure includes a base layer comprising gallium arsenide, an intrinsic semiconductor layer such as intrinsic hydrogenated amorphous silicon, an epitaxial $In_{1x}Ga_{1-x}As$ interlayer between and interfacing with the base layer and the intrinsic semiconductor layer, wherein 0.01<x<1.0, a doped hydrogenated amorphous silicon layer on the intrinsic hydrogenated amorphous silicon layer, and a transparent conductive layer above the doped hydrogenated amorphous silicon layer. The base layer and the $In_xGa_{1-x}As$ interlayer have a first doping type while the doped hydrogenated amorphous silicon layer has a second doping type opposite from the first doping type if used to form the emitter. However, if it is used to form a back-surface field, the doped hydrogenated amorphous silicon layer has the first doping type as well.

In a still further aspect, a heterojunction III-V solar cell structure that includes a base layer comprising one of GaAs and $In_yGa_{1-y}As$ where y<x, an epitaxial $In_xGa_{1-x}As$ interlayer between and interfacing with the base layer and the intrinsic hydrogenated amorphous silicon layer, wherein 0.01<x<1.0. The base layer and the $In_xGa_{1-x}As$ interlayer have the same doping type. A doped hydrogenated amorphous silicon layer is on the intrinsic hydrogenated amorphous silicon layer and a transparent conductive layer is on the doped hydrogenated amorphous silicon layer.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

One or more embodiments of the invention or elements thereof can be implemented in the form of a computer program product including a tangible computer readable recordable storage medium with computer usable program code for performing the method steps indicated. Furthermore, one or more embodiments of the invention or elements thereof can be implemented in the form of a system (or apparatus) including a memory, and at least one processor that is coupled to the memory and operative to perform exemplary method steps. Yet further, in another aspect, one or more embodiments of the invention or elements thereof can be implemented in the form of means for carrying out one or more of the method steps described herein; the means can include (i) hardware module(s), (ii) software module(s), or (iii) a combination of hardware and software modules; any of (i)-(iii) implement the specific techniques set forth herein, and the software modules are stored in a tangible computer-readable recordable storage medium (or multiple such media).

Techniques of the present invention can provide substantial beneficial technical effects. For example, one or more embodiments may provide one or more of the following advantages:

Reducing the contribution of the dark current component due to surface recombination at the heterointerface;
Improving open circuit voltage ($V_{oc}$);
Reducing surface recombination velocity (SRV) at the heterointerface;
Improving the short circuit density and fill factor.

These and other features and advantages of the present invention will become apparent from the following detailed description of illustrative embodiments thereof, which is to be read in connection with the accompanying drawings.

DETAILED DESCRIPTION OF PREFERRED EMBODIMENTS

Heterojunction III-V solar cell structures based on a-Si:H/III-V heterostructures offer a path for low-cost, high efficiency PV (photovoltaic) technology when implemented in conjunction with a layer transfer technique. The use of a-Si:H as an intrinsic layer (i-a:Si:H) can significantly improve the surface passivation of GaAs. US Pub. No. 2010/0307572 entitled "Heterojunction III-V Photovoltaic Cell Fabrication", the disclosure of which is incorporated by reference herein, discloses techniques for forming single and double heterojunction III-V PV cells.

Figure 1B:
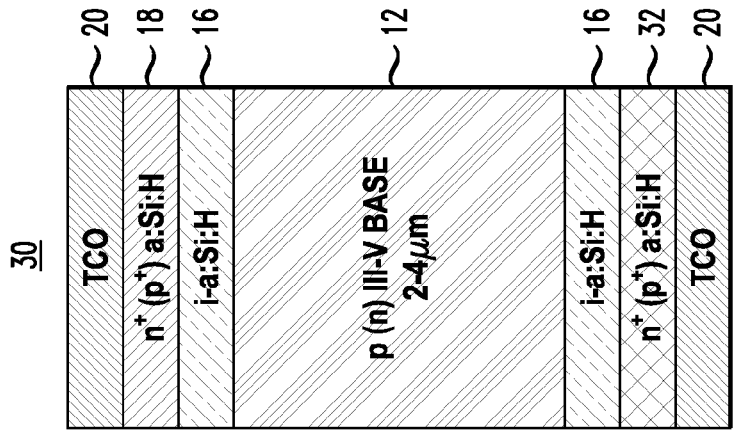
FIGS. 1A and 1B show a single and double heterojunction solar cell structures, respectively.
Figure 1A:
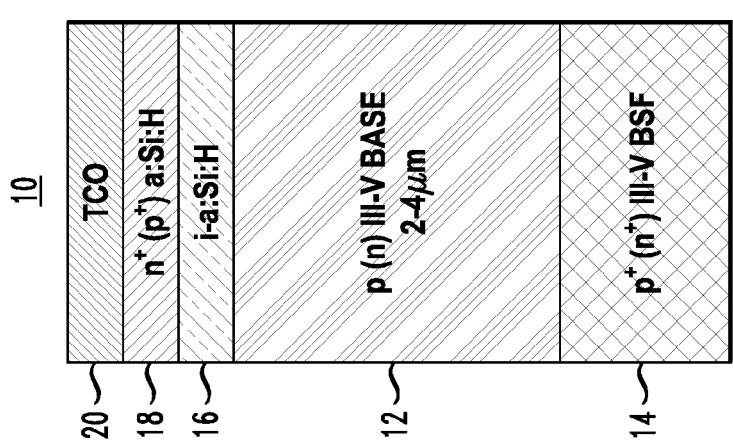

FIGS. 1A and 1B show single and double heterojunction solar cell structures 10, 30, respectively, that can be produced using techniques disclosed in US Pub. No. 2010/0307572. Referring to FIG. 1A, the structure 10 includes a base layer 12 comprising a III-V substrate that may be n-type or p-type. An optional BSF (back surface field) layer 14 is formed on the base layer. A doped amorphous hydrogenated silicon layer 18 is formed on an intrinsic amorphous silicon layer 16 on the base layer 12. The doped amorphous hydrogenated silicon layer 18 may have a doping type opposite from the doping type of the base layer. A transparent layer 20 such as a transparent conducting oxide (TCO) is formed above and preferably on the amorphous silicon layer 18. Front metal contacts including fingers and bus bars (not shown) may be formed on the transparent layer. Although, the i-a:Si:H layer 16 improves surface passivation of a GaAS base layer, the relatively high interface trap density at the a-Si/GaAs heterointerface leads to a significantly high dark current, degrading the open circuit voltage.

The double-heterojunction structure 30 shown in FIG. 1B includes two base/i-a:Si:H interfaces and two doped, amorphous hydrogenated silicon layers 18, 32. If the doped a-Si:H layer is used to form an emitter, its doping type is opposite to that (n-type or p-type) of the base layer. If used to form a BSF, its doping type would be the same as the base layer. As discussed above with respect to the single-heterojunction structure 10, high interface state density limits the open circuit voltage. In these particular examples, such voltage ($V_{oc}$) may be in the range of 500-600 mV.

Figure 3:
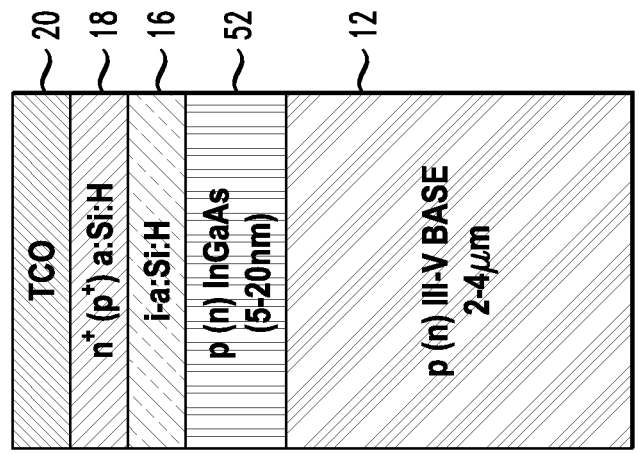
FIG. 3 shows a solar cell structure in accordance with an embodiment of the invention.
Figure 2:
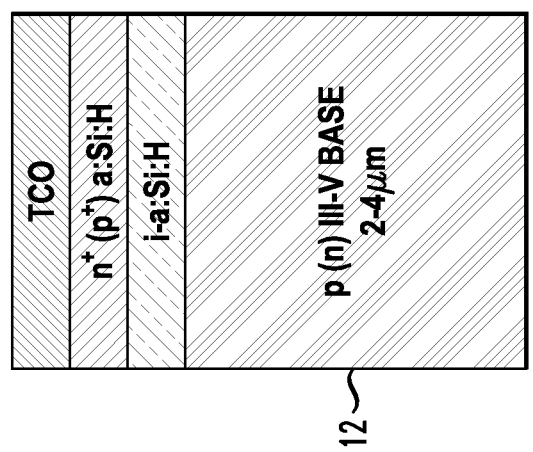
FIG. 2 shows a portion of the structures shown in FIGS. 1A and 1B.

FIG. 2 shows a structure 40 comprising a portion of the structures 10, 30 shown in FIGS. 1A and 1B and is provided for purposes of comparison to the embodiment of the invention shown in FIG. 3. FIG. 3 shows a corresponding portion of a solar cell structure 50 according to an exemplary embodiment of the invention, which may comprise part of a single or double-heterojunction solar cell structure. The structure 50 of FIG. 3 includes an epitaxial $In_xGa_{1-x}As$ interlayer 52 as described further below. This interlayer 52 is formed on the base layer. Such an interlayer 52 helps reduce the contribution of a dark current component due to surface recombination at the heterointerface and improves $V_{oc}$.

The structure 50 of the exemplary embodiment of the invention shown in FIG. 3 includes an $In_xGa_{1-x}As$ interlayer 52 that facilitates solar cell efficiency. The $In_xGa_{1-x}As$ interlayer can be grown epitaxially using conventional chemical vapor deposition (CVD) methods such as metal organic CVD (MOCVD) or molecular beam epitaxy (MBE). The range of x is $0.01<x<1$, preferably $0.05<x<0.8$. The interlayer 52 preferably has a thickness between 5-50 nm. In the exemplary embodiment of FIG. 3, it is 5-20 nm. The doping range for the $In_xGa_{1-x}As$ interlayer is 1e14-1e18/cm$^3$ and can be different from that of the base layer 12.

The base layer 12 provided in the exemplary embodiment of FIG. 3 is comprised of GaAs or $In_yGa_{1-y}As$, with the $In_xGa_{1-x}As$ interlayer 52, where y<x. The base doping level is from 1e14-1e18/cm$^3$. The doping type (n-type or p-type) of the doped amorphous silicon layer 18 is opposite to that of the base and $In_xGa_{1-x}As$ layers if it is used to form an emitter and is the same if it is used to form the back surface field. The base layer is between 0.2-30 μm in thickness in this exemplary embodiment. The n-type dopant concentration in certain layer(s) of the structure 50 ranges from $10^{16}$ atoms/cm$^3$ to $10^{21}$ atoms/cm$^3$, with the range of $10^{18}$-$10^{20}$ atoms/cm$^3$ being a typical range. The doping efficiency (the ratio of activated dopant atoms to the total dopant atoms) typically ranges from 0.1%-20%, although higher and lower doping efficiencies are possible. The doping efficiency is generally decreased by increasing the dopant atom concentration. The p-type dopant concentration likewise ranges from $10^{16}$-$10^{21}$ atoms/cm3 with the range of $10^{18}$-$10^{20}$ atoms/cm$^3$ being typical.

The transparent conductive layer 20 includes a conductive material that is transparent in the range of electromagnetic radiation at which photogeneration of electrons and holes occur within the solar cell structure. The transparent conductive layer 20 in the exemplary embodiment of FIG. 3 may comprise TCO's such as indium tin oxide (ITO), tin oxide (SnO), fluorine-doped tin oxide ($SnO_2$:F) or aluminum-doped zinc oxide (ZnO:Al). Transparent conducting films such as carbon nanotube-based films and graphene-based films may alternatively be employed to form this transparent conductive layer 20. These examples are to be considered exemplary as opposed to limiting. The thickness of the transparent conductive layer may vary depending on the type of transparent conductive material employed as well as the technique used in forming this layer. Typically, and in one exemplary embodiment, the thickness of the transparent conductive layer 20 is between 20-500 nm. Other thicknesses, including those less than 20 nm and/or greater than 500 nm, can alternatively be employed. The preferred thickness of the transparent conductive layer for minimizing reflection from the surface of Si is in the range of 70-110 nm for a TCO. Nanotube and graphene-based films may in the range of 2-50 nm. The transparent conductive layer is typically formed using a deposition process such as sputtering or CVD. Examples of CVD processes usable for a number of types of such layers include APCVD, LPCVD, PECVD, MOCVD and combinations thereof. RF and DC magnetron sputtering are among other techniques for forming the transparent conductive layer 20.

The intrinsic amorphous hydrogenated silicon semiconductor layer 16 formed on the $In_xGa_{1-x}As$ interlayer lacks a crystal structure with long range order. This layer can be referred to as an intrinsic semiconductor or undoped or i-type semiconductor, that is a substantially pure semiconductor without any significant electrical dopant impurity present. The number of charge carriers in the intrinsic semiconductor is determined by the properties of the material itself rather than the amount of impurities, i.e. dopants. The intrinsic hydrogenated amorphous semiconductor layer 16 provided in the embodiment of FIG. 3 is formed using any suitable physical or chemical vapor deposition process including appropriate source materials. In one embodiment, the intrinsic hydrogenated semiconductor layer is deposited in a process chamber containing a semiconductor precursor source gas and a carrier gas including hydrogen. Hydrogen atoms within the carrier gas are incorporated into the deposited material to form the intrinsic hydrogenated semiconductor containing material of the intrinsic semiconductor layer. The intrinsic semiconductor layer 16 may contain germanium and carbon atoms. The germanium and carbon distribution can be graded or constant throughout the layer. The intrinsic semiconductor layer 16 can be a multi-layer structure comprising a combination of layers, one or more of which contain graded or ungraded germanium and carbon and one or more of which do not contain these elements.

The hydrogenated amorphous silicon layer 18 may be formed from precursor gases such as $SiH_4$, $SiF_4$, or $H_2SiCl_2$ (DCS). The layer may be doped "in situ" by adding a dopant gas containing dopant atoms in the gas mixture. The dopant atoms are incorporated into the deposited material to form a hydrogenated doped semiconductor. Examples of dopant gases containing p-type dopant atoms are $B_2H_6$ and $B(CH_3)_3$ (TMB). Examples of an n-type dopant gas include $AsH_3$ and $PH_3$.

Figure 4A:
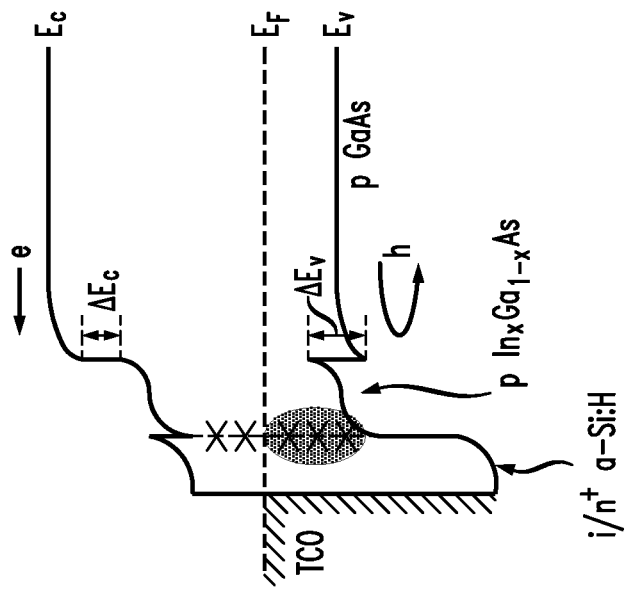
FIGS. 4A and 4B are energy band diagrams comparing two solar cell structures, one of which includes an InGaAs layer.
Figure 4B:
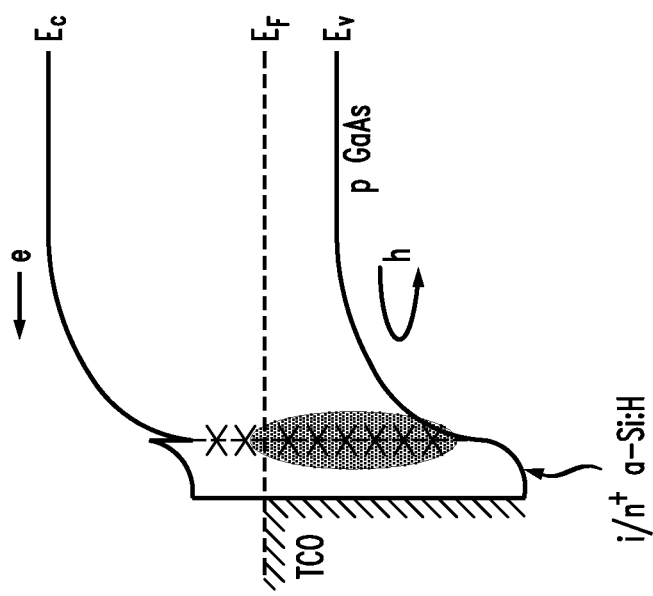

FIGS. 4A and 4B provide theoretical energy band (i.e. conduction band, valence band and Fermi energy) diagrams comparing solar cell structures with and without the epitaxial $In_xGa_{1-x}As$ interlayer. The improved surface passivation using the epitaxial $In_xGa_{1-x}As$ interlayer is believed to be due to lower density of active interface traps at the i-a:Si:H/$In_xGa_{1-x}As$ interface compared to that of an i-a:Si:H/GaAs interface and additional field-effect passivation at the $In_xGa_{1-x}As$/GaAs interface due to the band discontinuity.

Figure 5:
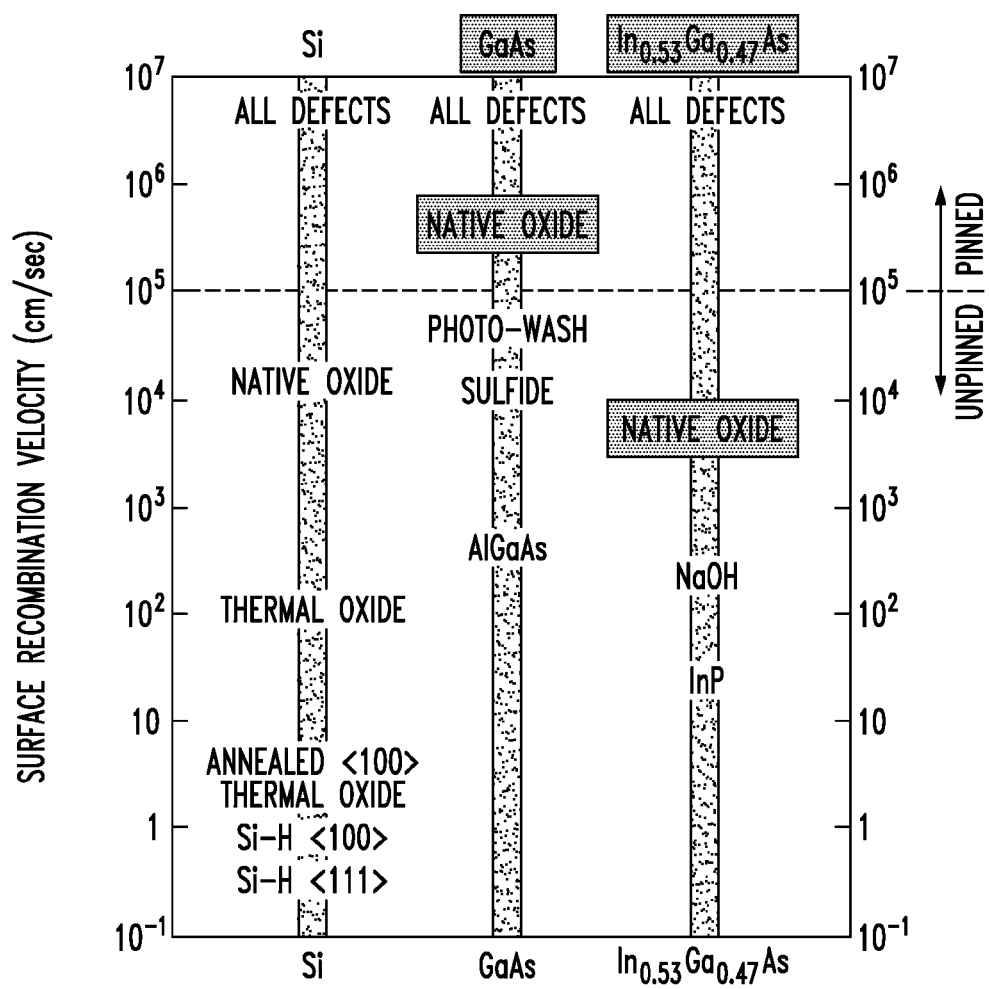
FIG. 5 is a chart including a comparison of surface recombination velocity for Si, GaAs and InGaAs.

FIG. 5 provides a comparison of SRV (surface recombination velocity) for $In_xGa_{1-x}As$ (specifically $In_{0.53}Ga_{0.47}As$) vs. GaAs. The reduction of the SRV at the heterointerface using the epitaxial $In_xGa_{1-x}As$ interlayer is believed attributable to the more forgiving nature of $In_xGa_{1-x}As$, which is easier to passivate as compared to GaAs and the field effect induced passivation due to the band discontinuity at the $In_xGa_{1-x}As$/GaAs interface. Prior to the deposition of the i-a-Si:H layer 16, the native oxide should be removed from the surface of the III-V layer. III-V materials are prone to rapid oxidation in the presence of oxygen. To prevent the formation of the native oxide, the oxide desorption and the subsequent processing step, i.e. deposition of i-a-Si:H, should be done in situ using an ultra high vacuum (UHV) system. Solar cell processing costs may, however, necessitate ex situ desorption of the native oxide. As a result, the formation of some native oxide during sample transfer in air for i-a-Si:H deposition can be inevitable. If some native oxide is formed during the sample transfer, the SRV between the III-V material and its native oxide plays a role in the total dark current of the structure.

The solar cell structure 50 described herein can constitute part of a single or double heterojunction cell structure. In the case of a double heterojunction cell structure, an $In_xGa_{1-x}As$ interlayer would be provided on both sides of the base layer.

Figure 6:
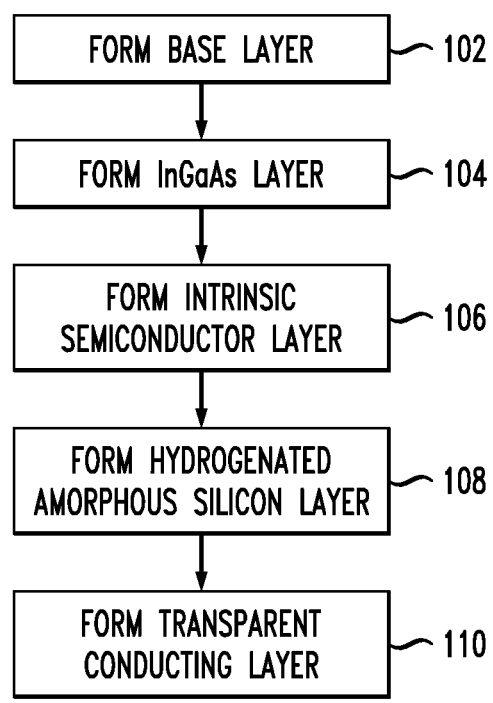
FIG. 6 is a flow chart showing manufacturing steps for a heterojunction III-V solar cell structure.

FIG. 6 is a flow chart showing the steps of forming the solar cell structure 50. As discussed above, the base layer 12 can be provided using any layer transfer technique from a GaAs substrate in step 102. The $In_xGa_{1-x}As$ layer is deposited epitaxially on the base layer via CVD or MBE in step 104. The intrinsic layer is formed by a physical or chemical vapor deposition process in step 106. The doped hydrogenated amorphous silicon layer 18 may be formed from precursor gases in a CVD process in step 108. The transparent conductive layer is formed using a deposition process such as sputtering or CVD in step 110. One or more of the steps 104, 106, 108 and 110 may precede or follow formation of the base layer. The method according to the invention accordingly encompasses forming the epitaxial $In_xGa_{1-x}As$ layer on the base layer whether or not the base layer is still part of the substrate.

Given the discussion thus far and with reference to FIG. 6, it will be appreciated that, in general terms, an exemplary method, according to an aspect of the invention, includes the step of obtaining a base layer comprising one of gallium arsenide and $In_yGa_{1-y}As$ where y<x, having a first doping type, forming an epitaxial $In_xGa_{1-x}As$ layer on the base layer where 0.01<x<1 having the first doping type, forming an intrinsic semiconductor layer on the $In_xGa_{1-x}As$ layer, and forming a doped hydrogenated amorphous silicon layer on the intrinsic semiconductor layer. A transparent conductive layer may be formed on the amorphous hydrogenated silicon layer in a further step. The doped hydrogenated amorphous silicon layer has a doping type opposite to that of the base layer if used as an emitter and has a doping type similar to that of the base layer if used as a back-surface field.

A heterojunction III-V solar cell structure is further provided in accordance with another aspect of the invention. The structure comprises a base layer comprising one of GaAs and $In_yGa_{1-y}As$ where y<x, an intrinsic semiconductor layer, and, an epitaxial $In_xGa_{1-x}As$ interlayer wherein 0.01<x<1.0 located between and interfacing with the base layer and the intrinsic semiconductor layer. The base layer and the $In_xGa_{1-x}As$ interlayer have the same doping type. A doped hydrogenated amorphous silicon layer is on the intrinsic semiconductor layer and a transparent conductive layer is on the doped hydrogenated amorphous silicon layer. FIG. 3 shows an exemplary embodiment of such a structure wherein the intrinsic semiconductor layer is shown as i-a-Si:H, the transparent conductive layer 20 is shown as a TCO, and specific thickness ranges of certain layers are provided. As discussed above, the thickness range $In_xGa_{1-x}As$ interlayer is 5-50 nm, but is deposited in a narrower range in the embodiment of FIG. 3.

In accordance with a further aspect of the invention, a heterojunction III-V solar cell structure comprises a base layer comprising gallium arsenide, an intrinsic semiconductor layer, and an epitaxial $In_xGa_{1-x}As$ interlayer between and interfacing with the base layer and the intrinsic semiconductor layer, wherein 0.01<x<1.0. A doped, hydrogenated amorphous silicon layer is on the intrinsic semiconductor layer and a transparent conductive layer is above the hydrogenated amorphous silicon layer. Both the intrinsic semiconductor layer 16 and the doped layer 18 may contain germanium and carbon atoms (e.g. a-$Si_{1-x'-y'}Ge_{x'}C_{y'}$:H where x' is between 0 and 1 and preferably between 0 and 0.5 and y' is between 0 and 0.6 and preferably between 0 and 0.3.). As discussed above, the intrinsic semiconductor layer can be a multi-layer structure. The doping type of the base layer and the $In_xGa_{1-x}As$ interlayer is the same. In other words, they have a "first" doping type that can be "n" or "p". The hydrogenated amorphous silicon layer has a second doping type opposite from the first doping type in this embodiment.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Words such as "above" or "below" refer to relative positions as opposed to altitude unless specified otherwise.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A heterojunction III-V solar cell structure comprising:
   a base layer comprising $In_yGa_{1-y}As$;
   an intrinsic semiconductor layer;
   an epitaxial $In_xGa_{1-x}As$ interlayer between and interfacing with the base layer and the intrinsic semiconductor layer, wherein $0.01<x<1.0$ and $0<y<x$;
   the base layer and the interlayer having the same doping type;
   a doped hydrogenated amorphous silicon layer on the intrinsic semiconductor layer;
   and a transparent conductive layer on the doped hydrogenated amorphous silicon layer.

2. The heterojunction III-V solar cell structure of claim 1, wherein $0.05 \leq x \leq 0.8$.

3. The heterojunction III-V solar cell structure of claim 1, wherein the intrinsic semiconductor layer comprises intrinsic hydrogenated amorphous silicon, and wherein the intrinsic hydrogenated amorphous silicon includes germanium and carbon atoms.

4. The heterojunction III-V solar cell structure of claim 1, wherein the $In_xGa_{1-x}As$ interlayer has a thickness between 5-50 nm.

5. The heterojunction III-V solar cell structure of claim 1, wherein the hydrogenated amorphous silicon layer has a doping type opposite to the doping type of the base layer.

6. A heterojunction III-V solar cell structure, comprising:
   a base layer comprising gallium arsenide;
   an intrinsic semiconductor layer comprising hydrogenated amorphous silicon;
   an epitaxial $In_xGa_{1-x}As$ interlayer between and interfacing with the base layer and the intrinsic semiconductor layer, wherein $0.01<x<1.0$;
   a doped hydrogenated amorphous silicon layer on the intrinsic semiconductor layer, and
   a transparent conductive layer above the hydrogenated amorphous silicon layer,
   the base layer and the $In_xGa_{1-x}As$ interlayer having a first doping type, the doped hydrogenated amorphous silicon layer having a second doping type opposite from the first doping type.

7. The heterojunction III-V solar cell structure of claim 6, wherein $0.05 \leq x \leq 0.8$.

8. The heterojunction III-V solar cell structure of claim 6, wherein the $In_xGa_{1-x}As$ interlayer has a thickness between 5-50 nm.

9. A heterojunction III-V solar cell structure, comprising:
   an intrinsic semiconductor layer comprising hydrogenated amorphous silicon; an epitaxial $In_xGa_{1-x}As$ interlayer; a base layer comprising one of GaAs and $In_yGa_{1-y}As$ where $0<y<x$; the epitaxial $In_xGa_{1-x}As$ interlayer being between and interfacing with the base layer and the intrinsic semiconductor layer, wherein $0.05<x<0.8$; the base layer and the $In_xGa_{1-x}As$ interlayer having the same doping type; a doped hydrogenated amorphous silicon layer on the intrinsic semiconductor layer, and a transparent conductive layer on the doped hydrogenated amorphous silicon layer.

10. A heterojunction III-V solar cell structure, comprising:
    an intrinsic semiconductor layer comprising a plurality of hydrogenated amorphous silicon layers; an epitaxial $In_xGa_{1-x}As$ interlayer; a base layer comprising one of GaAs and $In_yGa_{1-y}As$ where $0<y<x$; the epitaxial $In_xGa_{1-x}As$ interlayer being between and interfacing with the base layer and the intrinsic semiconductor layer, wherein $0.05<x<0.8$; the base layer and the $In_xGa_{1-x}As$ interlayer having the same doping type; a doped hydrogenated amorphous silicon layer on the intrinsic semiconductor layer, and a transparent conductive layer on the doped hydrogenated amorphous silicon layer.

11. A heterojunction III-V solar cell structure, comprising:
    a base layer comprising GaAs;
    an intrinsic semiconductor layer comprising hydrogenated amorphous silicon;
    an epitaxial $In_xGa_{1-x}As$ interlayer between and interfacing with the base layer and the intrinsic semiconductor layer, wherein $0.01<x<1.0$, the base layer and the $In_xGa_{1-x}As$ interlayer having the same doping type;
    a doped hydrogenated amorphous silicon layer on the intrinsic semiconductor layer, and
    a transparent conductive layer on the doped hydrogenated amorphous silicon layer.

12. A method comprising: obtaining a base layer comprising $In_yGa_{1-y}As$;
    forming an intrinsic semiconductor layer;
    forming an epitaxial $In_xGa_{1-x}As$ interlayer between and interfacing with the base layer and the intrinsic semiconductor layer, wherein $0.01<x<1.0$ and $0<y<x$;
    the base layer and the interlayer having the same doping type;
    forming a doped hydrogenated amorphous silicon layer on the intrinsic semiconductor layer;
    and forming a transparent conductive layer on the doped hydrogenated amorphous silicon layer.

13. The method of claim 12, wherein $0.05<x<0.8$.

14. The method of claim 12, wherein the intrinsic semiconductor layer comprises intrinsic hydrogenated amorphous silicon.

15. The method of claim 14, wherein the intrinsic hydrogenated amorphous silicon further includes germanium and carbon atoms.

16. The method of claim 14, wherein $0.05<x<0.8$.

* * * * *